(12) United States Patent
Watkins

(10) Patent No.: US 8,816,371 B2
(45) Date of Patent: Aug. 26, 2014

(54) COATED COLOR-CONVERTING PARTICLES AND ASSOCIATED DEVICES, SYSTEMS, AND METHODS

(75) Inventor: Charles M. Watkins, Eagle, ID (US)

(73) Assignee: Micron Technology, Inc., Boise, ID (US)

(*) Notice: Subject to any disclaimer, the term of this patent is extended or adjusted under 35 U.S.C. 154(b) by 66 days.

(21) Appl. No.: 13/308,199

(22) Filed: Nov. 30, 2011

(65) Prior Publication Data

US 2013/0134460 A1 May 30, 2013

(51) Int. Cl.
*H01L 33/00* (2010.01)
*H01L 21/00* (2006.01)

(52) U.S. Cl.
USPC ................... 257/98; 257/E33.061; 438/29

(58) Field of Classification Search
USPC .................................... 257/E33.061
See application file for complete search history.

(56) References Cited

U.S. PATENT DOCUMENTS

| | | | |
|---|---|---|---|
| 4,508,760 A | 4/1985 | Olson et al. | |
| 5,069,972 A | 12/1991 | Versic | |
| 5,272,007 A | 12/1993 | Jenkinson et al. | |
| 5,297,553 A | 3/1994 | Sliwa, Jr. et al. | |
| 6,710,356 B2 | 3/2004 | Leblans et al. | |
| 6,713,177 B2 | 3/2004 | George et al. | |
| 7,037,640 B2 | 5/2006 | Koninckx et al. | |
| 7,193,226 B2 | 3/2007 | den Bergh et al. | |
| 7,297,404 B2 | 11/2007 | Bayless | |
| 7,846,743 B2 | 12/2010 | Tai et al. | |
| 2002/0150760 A1 | 10/2002 | Klinedinst | |
| 2003/0038249 A1* | 2/2003 | Hackenschmied et al. ............. | 250/484.4 |
| 2005/0158454 A1 | 7/2005 | Lee et al. | |
| 2006/0091789 A1* | 5/2006 | Aoyama et al. ............... | 313/502 |
| 2007/0125984 A1* | 6/2007 | Tian et al. ............... | 252/301.4 S |
| 2009/0215208 A1* | 8/2009 | Coe-Sullivan et al. ......... | 438/22 |
| 2009/0291200 A1 | 11/2009 | Bedinger et al. | |
| 2010/0006880 A1 | 1/2010 | Wang et al. | |
| 2010/0119839 A1* | 5/2010 | Chen ............................ | 428/422 |
| 2010/0123386 A1 | 5/2010 | Chen | |

FOREIGN PATENT DOCUMENTS

| | | |
|---|---|---|
| CN | 101603678 A | 12/2009 |
| JP | 2009105234 A | 5/2009 |

OTHER PUBLICATIONS

International Search Report and Written Opinion issued Feb. 25, 2013 in International Application No. PCT/US2012/066529, 15 pages.

* cited by examiner

*Primary Examiner* — Lex Malsawma
(74) *Attorney, Agent, or Firm* — Perkins Coie LLP

(57) ABSTRACT

Coated color-converting particles and associated devices, systems, and methods are disclosed herein. A coating of the coated color-converting particles can include, for example, a parylene, such as a fluorinated parylene. In particular embodiments, the coating can be configured to protect a color-converting material of a particle core of the coated color-converting particles from detrimental reactions. For example, the coating can prevent, slow, or otherwise inhibit detrimental reactions between the color-converting material and a matrix material or between the color-converting material and an environmental constituent that can diffuse through a matrix. In particular embodiments, the coated color-converting particles can be incorporated into a matrix to form a composite. The composite can be used, for example, with a radiation transducer. Methods associated with the coated color-converting particles can include, for example, separating coated color-converting particles having acceptable coatings from coated color-converting particles having unacceptable coatings using relative buoyancy.

34 Claims, 4 Drawing Sheets

COATED COLOR-CONVERTING PARTICLES AND ASSOCIATED DEVICES, SYSTEMS, AND METHODS

TECHNICAL FIELD

The present technology relates to color-converting particles, such as coated color-converting particles, and associated devices, systems, and methods. In particular, the present technology relates to parylene-coated color-converting particles, components of solid-state radiation transducer devices including parylene-coated color-converting particles, and associated devices, systems, and methods.

BACKGROUND

Color-converting materials (e.g., phosphor materials) absorb light at certain wavelengths and emit light at different wavelengths. Optical components including color-converting materials are used in a variety of electronic devices, including illumination devices and devices with electronic displays, such as mobile phones, digital cameras, and televisions. In many such devices, color-converting materials are used in conjunction with solid-state radiation transducers ("SSRTs"). Examples of SSRTs include light-emitting diodes, organic light-emitting diodes, and polymer light-emitting diodes. In a common application, a color-converting material is used to modify the light output from an SSRT to include additional or different wavelengths. SSRTs typically emit light having a narrow range of wavelengths. Color-converting materials can absorb some or all of the emitted light and convert it into light having a different range of wavelengths. For example, some SSRT devices include an SSRT that emits blue light and a color-converting material that absorbs some of the blue light and converts it into yellow light. The combination of blue light from the SSRT and yellow light from the color-converting material can appear white. Known color-converting materials useful for this purpose include yttrium aluminum garnet (YAG) doped with various rare earth elements, such as cerium.

Color-converting materials tend to degrade over time to a greater extent than most other materials used in manufacturing electronic devices. For example, certain color-converting materials are prone to react with oxygen or water in the environment. Such reactions can alter the properties of the color-converting materials, which can lower the efficiency of electronic devices including the color-converting materials. Furthermore, color-converting materials often are milled into small particles prior to use, which typically improves their optical properties, but also increases their susceptibility to degradation. A quantity of color-converting material in the form of numerous small particles has a significantly greater surface area available for detrimental reactions than the same quantity of color-converting material in the form of a single structure, such as a block. The choice of particle size in certain applications can be a tradeoff between decreasing particle size to improve optical properties and increasing particle size to slow degradation.

Color-converting materials used in some SSRT devices are particularly prone to degradation. To protect color-converting materials and other sensitive structures, SSRT devices can include a matrix around the color-converting materials, such as an encapsulant matrix. For example, an encapsulant matrix can surround the delicate components of an SSRT device, with the exception of leads or other contacts for electrical connection to a circuit. Common matrix materials include silicone and epoxy. Despite being incorporated into an encapsulant matrix, color-converting materials still degrade, which can adversely affect the reliability and longevity of electrical devices including the color-converting materials. Accordingly, there is a continuing need for innovation related to color-converting materials, such as to improve the reliability and longevity of color-converting materials.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. In the drawings, like reference numerals designate corresponding parts throughout the several views.

DETAILED DESCRIPTION

Figure 1:
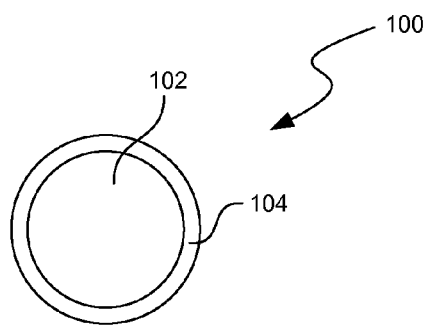
FIG. 1 is a partially schematic cross-sectional diagram of a coated color-converting particle configured in accordance with several embodiments of the present technology.

The present technology is directed to devices, systems, and methods related to color-converting particles, including parylene-coated color-converting particles. Color-converting particles typically are incorporated into encapsulant matrices prior to use in electronic devices. As discussed above, however, color-converting materials of color-converting particles within encapsulant matrices still can be prone to degradation. For example, a matrix can be permeable to a reactive environmental constituent. Furthermore, reactions between matrix materials and color-converting materials may contribute to degradation of the color-converting materials. Color-converting materials and matrix materials vary widely, so a diversity of particular reactions may be associated with this type of degradation. Many silicone matrix materials, for example, are used with a curing matrix material (e.g., a curing matrix material including platinum) that may catalyze detrimental reactions of certain color-converting materials. High operating temperatures of device components (e.g., SSRTs) that incorporate color-converting materials may promote detrimental reactions between the color-converting materials and the matrix materials. Color-converting materials of smaller SSRT devices can be exposed to higher temperatures than color-converting materials of larger SSRT devices. For example, color-converting materials of smaller SSRT devices may be positioned closer to an SSRT, which can be a significant heat source, than color-converting materials of larger SSRT devices. Accordingly, as the dimensions of SSRT devices shrink to accommodate advanced applications, heat-related degradation of color-converting materials may become increasingly problematic.

Reactions of color-converting materials of color-converting particles with environmental constituents (e.g., oxygen or water) prior to incorporating the color-converting particles into an encapsulant matrix or after incorporating the color-converting particles into an encapsulant matrix may contribute to degradation of the color-converting materials. Prior to incorporating color-converting particles into an encapsulant matrix, the color-converting particles typically are stored in generally air-tight containers, but can be exposed to environmental constituents when the generally air-tight containers are opened. After color-converting particles are incorporated into an encapsulant matrix, environmental constituents may be trapped on or within the color-converting particles or may diffuse through the encapsulant matrix to react with color-converting materials of the color-converting particles. Silicone, for example, may be porous to environmental constituents under certain conditions. Detrimental reactions between color-converting materials and environmental constituents may include, for example, oxidation or reduction of the color-converting materials. The detrimental reactions can occur under various conditions, such as standard temperature and pressure.

Several embodiments of the present technology include a color-converting particle having a coating including a parylene. In certain applications, a coating including a parylene configured in accordance with several embodiments of the present technology can prevent, slow, or otherwise inhibit degradation of a color-converting material of a coated color-converting particle. For example, a coating including a parylene configured in accordance with several embodiments of the present technology can prevent, slow, or otherwise inhibit detrimental reactions between a color-converting material of a coated color-converting particle and an environmental constituent (e.g., oxygen or water) prior to, during, or after incorporating the coated color-converting particle into a matrix. The environmental constituent can be an environmental constituent that is reactive with the color-converting material at standard temperature and pressure. When the coated color-converting particle is within a matrix, the matrix can be permeable to the environmental constituent at standard temperature and pressure. Furthermore, a coating including a parylene configured in accordance with several embodiments of the present technology may prevent, slow, or otherwise inhibit detrimental reactions between a color-converting material of a coated color-converting particle and a matrix material during or after incorporation of the coated color-converting particle into a matrix including the matrix material. The matrix material can be a matrix material that is reactive with the color-converting material at an operating temperature and pressure of a structure including the matrix material and the color-converting particle when an associated radiation transducer is active.

FIG. 1 is a partially schematic cross-sectional diagram of a coated color-converting particle 100 configured in accordance with several embodiments of the present technology. The coated color-converting particle 100 includes a particle core 102 and a coating 104. The particle core 102 includes a color-converting material. For example, the particle core 102 can be a solid mass of a color-converting material or can include a color-converting material in combination with one or more other materials. When the particle core 102 includes a non-color-converting material, the color-converting material can be coated on the non-color-converting material, positioned within the non-color-converting material (e.g., dispersed within the non-color-converting material), homogenously mixed with the non-color-converting material, heterogeneously mixed with the non-color-converting material, or otherwise integrated with the non-color-converting material.

Color-converting materials can be any of a variety of suitable materials, such as phosphor materials that exhibit luminescence. Coatings 104 configured in accordance with several embodiments of the present technology are compatible with color-converting materials of any suitable type. In several embodiments of the present technology, the color-converting material in the particle core 102 is a doped garnet, such as a doped yttrium aluminum garnet (YAG) or a doped lutetium aluminum garnet (LuAG). For example, the color-converting material can be cerium(III)-doped YAG, neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium(IV)-doped YAG, dysprosium-doped YAG, samarium-doped YAG, or terbium-doped YAG. Doped color-converting materials may be more susceptible to detrimental reactions with matrix materials or environmental constituents (e.g., oxygen or water) than undoped color-converting materials. Garnet color-converting materials typically are more resistant to degradation than other color-converting materials, but still may have improved reliability and longevity when coated according to one of several embodiments of the present technology. In at least some embodiments of the present technology, the particle core 102 can include a different color-converting material, such as a color-converting material more susceptible to degradation than a garnet color-converting material. Examples of other color-converting materials include those known in the art, for example suitable doped and undoped silicates (e.g., europium-doped silicates of barium, calcium, strontium, and magnesium), nitrides, silicon-nitrides (e.g., europium-doped silicon nitrides of calcium and aluminum) and sulfides (e.g., zinc sulfide). Color-converting materials of particle cores 102 configured in accordance with several embodiments of the present technology can have a variety of optical properties. In several embodiments of the present technology, the particle core 102 includes a color-converting material having an emission peak of from about 400 nm to about 800 nm, e.g., from about 500 nm to about 700 nm or from about 520 nm to about 580 nm.

The particle core 102 is shown in FIG. 1 as generally spheroid for simplicity of illustration. In several embodiments of the present technology, the particle core 102 can be generally spheroid or can have another regular shape or an irregular shape. The particle core 102 also can have a variety of surface characteristics, such as faceting, varying degrees of roughness, and varying degrees of porosity. The particle core 102 can have a variety of sizes. For example, the particle core 102 can have an effective diameter of from about 1 micron to about 200 microns, e.g., from about 2 microns to about 100 microns or from about 4 microns to about 50 microns. Coatings 104 configured in accordance with several embodiments of the present technology are compatible with particle cores 102 of any suitable shape, surface characteristics, and size.

In particular embodiments of the present technology, the coating 104 can include a parylene. As used herein, the term "parylene" refers to a polymer having one of the Formulas I, II, and III (below) or a combination thereof:

Formula I

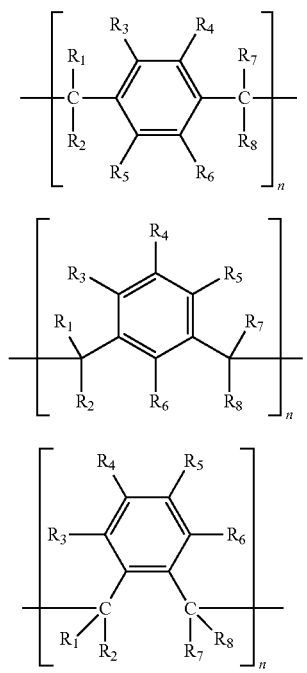

Formula II

Formula III

The polymer can be a homopolymer, a copolymer, a polymer blend, or combinations thereof. $R_1$, $R_2$, $R_7$, and $R_8$ each can be independently selected from hydrogen, alkyls, heteroalkyls, aryls, and halogens. The alkyls can be hydrocarbon radicals having between one and six carbons. The halogens can be chlorine, fluorine, bromine, and iodine. The heteroalkyls can be alkyl substituents having at least one heteroatom, such as oxygen, sulfur, nitrogen, silicon, and phosphorus. In several embodiments of the present technology, one, two, three, or all four of $R_1$, $R_2$, $R_7$, and $R_8$ are fluorine. $R_3$ to $R_6$ each can be independently selected from hydrogen, alkyls, aryls, halogens, heteroalkyls, hydroxyls, aminos, alkylaminos, arylaminos, aroylaminos, carbamoylaminos, aryloxys, acyls, thios, alkylthios, cyanos, and alkoxies. In several embodiments of the present technology, $R_3$ to $R_6$ are independently selected from hydrogen and alkyls having between one and six carbons. One or more of $R_3$ to $R_6$ also can include or be a functional group, such as an amino, a thio, a hydroxy, or a halo (e.g., a chloro or a fluoro).

Examples of specific parylenes suitable for use in several embodiments of the present technology are shown below:

Parylene N

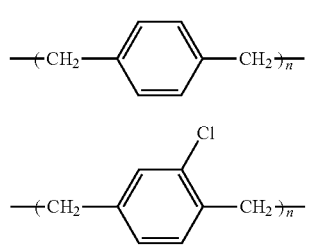

Parylene C

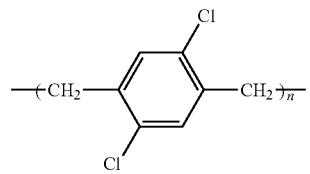

Parylene D

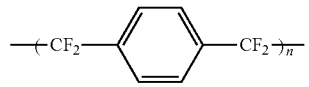

Parylene AF-4

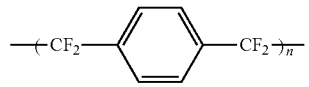

Parylene N, Parylene C, Parylene D, Parylene AF-4, precursors of these parylenes (e.g., dimers), and suitable deposition tools are available, for example, from Specialty Coating Systems (Indianapolis, Ind.) and Kisco Conformal Coatings (Tokyo, Japan). In several embodiments of the present technology, the coating 104 includes a fluorinated parylene. In a fluorinated parylene, one or more of $R_1$, $R_2$, $R_7$, and $R_8$ in Formulas I-III (above) is fluorine. Parylene AF-4 is an example of a fluorinated parylene. Parylene AF-4 is available, for example, as PARYLENE HT from Specialty Coating Systems (Indianapolis, Ind.).

Parylenes can be particularly effective for protecting color-converting materials from detrimental reactions. Parylenes typically are chemically inert with respect to almost all solvents, acids, bases, and other reactive materials. Parylenes also typically are strongly hydrophobic and provide an effective barrier to diffusion of environmental constituents (e.g., oxygen and water). In addition, parylenes typically are optically transparent and not detrimental to the efficiency of optically-activated color-converting materials. Since parylenes typically have very low dielectric constants, however, they can interfere with the operation of electrically-activated color-converting materials. In comparison to other parylenes, fluorinated parylenes, such as parylene AF-4, can have greater resistance to oxidative degradation and degradation from exposure to ultraviolet light. For these and other reasons, fluorinated parylenes, such as parylene AF-4, can be especially well suited for use with color-converting materials of SSRT devices.

The coating 104 configured in accordance with several embodiments of the present technology can generally surround the particle core 102. In several embodiments of the present technology, the coating 104 is continuous, generally continuous, defect free, or generally defect free. Defects can be, for example, pinholes, cracks, or other openings. Parylenes are especially well suited for the formation of coatings 104 that are continuous and defect free. In comparison to other coating materials, parylenes can form particularly uniform coatings 104 having excellent conformance to surface features. A coating 104 that is continuous, generally continuous, defect free, or generally defect free typically is more effective for protecting a color-converting material in a particle core 102 than a coating that is less continuous or less defect free. An opening in the coating 104 can compromise the effectiveness of the coating for protecting a color-converting material of a particle core 102. For example, detrimental reactions can occur at the site of the opening, which can disrupt the connection between the coating 104 and the particle core 102 around the site of the opening. This can enlarge the opening and allow detrimental reactions to occur at additional portions of the surface of the particle core 102.

In several embodiments of the present technology, the coating 104 has an average thickness greater than 0.1 microns (e.g., from 0.1 microns to about 100 microns), greater than about 0.11 microns (e.g., from about 0.11 microns to about 100 microns), greater than about 0.2 microns (e.g., from about 0.2 microns to about 50 microns), or greater than about 0.4 microns (e.g., from about 0.4 microns to about 10 microns). In general, thicker coatings 104 (e.g., coatings thicker than 0.1 microns) are more likely to be continuous, generally continuous, defect free, or generally defect free. As discussed above, such a coating 104 can be more protective of a color-converting material in a particle core 102 than a coating that is less continuous or less defect free. In addition or instead, thicker coatings 104 (e.g., coatings thicker than 0.1 microns) can offer more protection from diffusion of a matrix material and/or an environmental constituent capable of detrimental reaction with a color-converting material in a particle core 102 than thinner coatings. Furthermore, in certain applications, it is desirable to disperse color-converting materials within a matrix, such as an encapsulant matrix. The coating 104 can promote separation of individual particle cores 102. In a limited number of applications, at very high thicknesses, the coating 104 can limit the potential concentration of particle cores 102 in a matrix of a particular size. Accordingly, in some embodiments, the coating 104 has a thickness less than about 100 microns (e.g., less than about 50 microns or less than about 10 microns).

Forming the coated color-converting particle 100 can include forming the particle core 102, such as by milling a bulk color-converting material. Suitable particle cores 102 are available from Intematix (Fremont, Calif.). A variety of processes can be used to form the coating 104. In several embodiments of the present technology, a variation of chemical vapor deposition (CVD) is used to form the coating 104. Other processes for forming the coating 104 include atomic layer deposition, thermal evaporation deposition, physical vapor deposition, spray coating, and dip coating. Parylenes can be particularly well suited for CVD. In several embodiments of the present technology, a parylene precursor (e.g., a dimer) is vaporized and then converted into parylene monomer radicals that polymerize on the surfaces of particle cores 102. Since the parylene monomer radicals are deposited molecularly, the resulting coating 104 can have particularly high purity, uniformity, and conformance to surface features of the particle cores 102. Contaminants in the parylene precursor typically are left behind as waste solids after vaporization of the parylene precursor.

Figure 2:
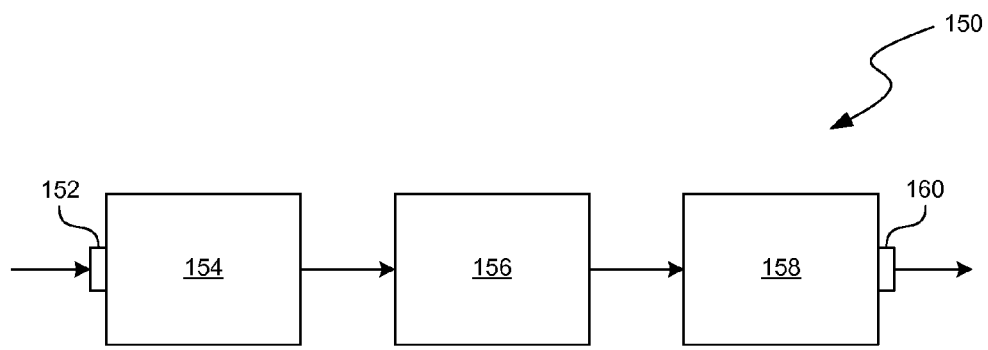
FIG. 2 is a block diagram of a system for making coated color-converting particles configured in accordance with several embodiments of the present technology.

FIG. 2 is a block diagram of a system 150 configured to form the coating 104. The system 150 includes an inlet 152, a vaporization chamber 154, a conversion chamber 156, a deposition chamber 158, and an outlet 160. A parylene precursor (e.g., a dimer) can be introduced into the system 150 through the inlet 152. In embodiments of the present technology, the parylene precursor can be a solid in the form of a single mass or an agglomeration of particles (e.g., powder or flakes). A boat, for example, can be used to introduce the parylene precursor into the vaporization chamber 154. The vaporization chamber 154 can be a conduit, such as a pipe. The operating temperature and pressure of the vaporization chamber 154 can be selected according to the physical properties of the parylene precursor. For example, the operating temperature and pressure of the vaporization chamber 154 can be selected to correspond to the vapor phase of the parylene precursor. After vaporization, the parylene precursor can travel into the conversion chamber 156 for conversion into parylene monomer radicals. Heat alone can be sufficient to convert most parylene precursors into parylene monomer radicals. In several embodiments of the present technology, volatilization of a parylene precursor and conversion of the parylene precursor into parylene monomer radicals occur in the same chamber. Separation of these process steps, however, can be useful to reduce (e.g., minimize) unwanted deposition.

The operating temperature of the conversion chamber 156 can be, for example, from about 650° C. to about 800° C. The specific operating temperature can be selected according to the type of parylene to be deposited. For example, the operating temperature of the conversion chamber 156 can be about 750° C. to form the monomer of parylene AF-4. In some embodiments, multiple portions of the system 150 can be operated under vacuum (e.g., pressure in the vaporization chamber 154, the conversion chamber 156, and the deposition chamber 158 can be continuously pumped down). A pump can be included to maintain a vacuum. In some embodiments, the deposition chamber 158 is closest to a pump, the vaporization chamber 154 is furthest from the pump, and the conversion chamber 156 is between the deposition chamber 158 and the vaporization chamber 154 relative to the pump.

In the system 150, parylene monomer radicals travel into the deposition chamber 158. Structures to be coated, such as the particle cores 102, can be preloaded into the deposition chamber 158. The deposition chamber 158 can be operated at a temperature and pressure sufficient to cause the parylene monomer radicals to form parylene on the particle cores 102. With regard to some parylenes, the operating temperature of the deposition chamber 158 can be standard temperature. Typically, the deposition chamber 158 is operated at a strong vacuum (e.g., about 0.1 torr), with the parylene monomer radicals providing generally all of the vapor pressure within the deposition chamber. Vapor including the parylene monomer radicals can be continuously introduced into the deposition chamber 158 and withdrawn through the outlet 160. The level of vacuum at the outlet 160 can be used to control the residence time of the parylene monomer radicals within the deposition chamber 158. The residence time can be selected according to the deposition rate for the parylene being deposited. Fluorinated parylenes, such as parylene AF-4, typically deposit more slowly than non-fluorinated parylenes. Slow deposition can improve the quality of the coating 104, such as by increasing the uniformity of the coating 104 or by decreasing the likelihood that individual particle cores 102 in motion during the deposition will stick to each other or to internal surfaces of the deposition chamber 158.

In embodiments of the present technology, particle cores 102 can be moved within the deposition chamber 158 in the presence of parylene monomer radicals. This can be useful to facilitate uniformly applying the coating 104. Moving the particle cores 102 can include tumbling, tossing, or dropping, among others, the particle cores through the vapor including the parylene monomer radicals. Alternatively, the vapor including the parylene monomer radicals can be distributed through the particle cores 102, such as to fluidize the particle cores. The deposition chamber 158 also can include a structure to prevent the particle cores 102 from sticking together. For example, the deposition chamber 158 can include a screen.

Figure 3:
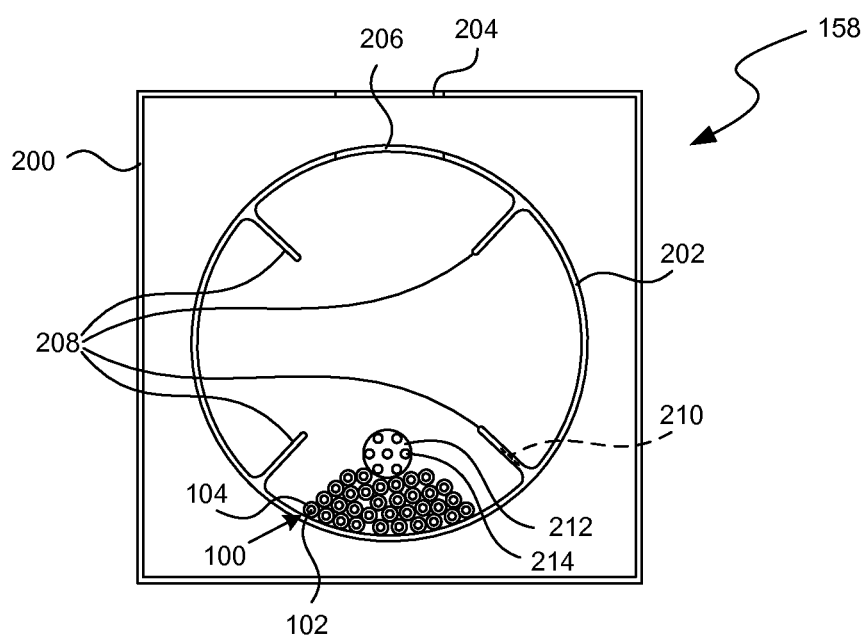
FIG. 3 is a partially schematic cross-sectional diagram of a deposition chamber configured in accordance with several embodiments of the present technology.

FIG. 3 is a partially schematic cross-sectional diagram of a deposition chamber 158 configured in accordance with several embodiments of the present technology. The deposition chamber 158 includes a chamber wall 200 enclosing a drum 202. A chamber hatch 204 and a drum hatch 206 of the chamber wall 200 and the drum 202, respectively, provide access to an internal portion of the drum. The drum 202 includes four vanes 208 configured to lift and drop particle cores 102 or coated color-converting particles 100 as the drum is rotated. In several other embodiments, the drum 202 can include a different number of vanes 204. The deposition chamber 158 can also include a different structure for moving the particle cores 102 or coated color-converting particles 100 through the vapor including the parylene monomer radicals. One of the vanes 204 shown in FIG. 3 includes a screen 210 having openings sized to prevent the particle cores 102 or coated color-converting particles 100 from sticking together during deposition. The deposition chamber 158 also includes a ball 212 having surface indentations 214. The ball 212 or another free-moving structure can be configured to tumble in the drum 202 with the particle cores 102 or coated color-converting particles 100 to agitate the particle cores or coated color-converting particles during deposition.

Despite care taken to deposit the coating 104 uniformly on individual particle cores 102, some coated color-converting particles 100 from a deposition process may be defective. For example, it can be difficult to prevent some particle cores 102 from sticking to each other or to internal surfaces of the deposition chamber 158 and then breaking free during or after the deposition process. If stuck particle cores 102 break free too late during the deposition process, portions of the particle cores that were not exposed during a portion of the deposition process can remain uncoated or inadequately coated. The same is true with regard to stuck particle cores 102 that break free after the deposition process. Several embodiments of the present technology include separating coated color-converting particles 100 having defective coatings 104 from other coated color-converting particles.

Figure 4:
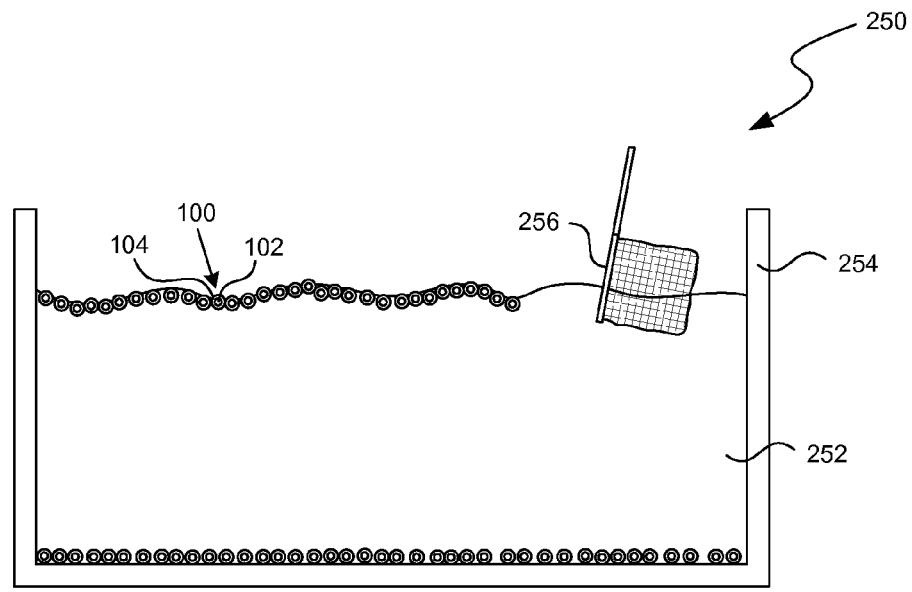
FIG. 4 is a partially schematic cross-sectional diagram of a separator configured in accordance with several embodiments of the present technology.

FIG. 4 is a partially schematic cross-sectional diagram of a separator 250 configured in accordance with several embodiments of the present technology. The separator 250 includes a separation liquid 252 in a container 254. Some coated color-converting particles 100 in the separator 250 are floating in the separation liquid 252 while other coated color-converting particles are sunken in the separation liquid. Coated color-converting particles 100 having continuous coatings 104 typically are more buoyant than coated color-converting particles having defective coatings. For example, coatings 104 that are continuous may tend to exclude liquids or otherwise impart hydrophobic characteristics to the coated color-converting particles 100, while coatings that are not continuous may tend to allow liquids to penetrate into the particle cores 102. Color-converting materials can be porous and capable of absorbing and/or adsorbing liquids. When the color-converting material of a coated color-converting particle 100 is partially or fully saturated with a liquid, the coated color-converting particle can become heavier than the liquid, causing the coated color-converting particle to sink.

Separating coated color-converting particles 100 based on buoyancy according to several embodiments of the present technology can include adding a plurality of coated color-converting particles to the separation liquid 252 so that a portion of the plurality of coated color-converting particles floats and another portion of the plurality of coated color-converting particles sinks. The floating portion of the plurality of coated color-converting particles 100 typically is the portion having coatings 104 that are continuous. The non-floating portion of the plurality of coated color-converting particles 100 typically is the portion having coatings 104 that are not continuous. The separation liquid 252 can be, for example, a polar liquid (e.g. water) or a non-polar liquid (e.g., hexane). Parylenes typically are strongly hydrophobic, so coatings 104 including a parylene can be more likely to exclude polar liquids than non-polar liquids. In several embodiments of the present technology, the separation liquid 252 is polar to increase the likelihood that the coatings 104 will exclude the separation liquid. In other embodiments of the present technology, the separation liquid 252 can be non-polar to decrease the likelihood that the coatings 104 will exclude the separation liquid.

Separating coated color-converting particles 100 according to embodiments of the present technology also can include agitating a plurality of coated color-converting particles. For example, a plurality of coated color-converting particles 100 can be agitated before the coated color-converting particles are mixed into the separation liquid 252 or while the coated color-converting particles are within the separation liquid. Agitating the coated color-converting particles 100 can break apart some or all of the coated color-converting particles that are stuck together. Agitating can include, for example, stirring or lightly grinding the plurality of coated color-converting particles 100. The plurality of coated color-converting particles 100 also can be screened using a screen having openings sized to allow passage of most individual coated color-converting particles 100 and exclude passage of most agglomerations of coated color-converting particles.

The floating portion of the plurality of coated color-converting particles 100 can be separated from the non-floating portion of the plurality of coated color-converting particles. For example, the floating portion of the plurality of coated color-converting particles 100 can be skimmed from the separation liquid 252 using a skimming net 256, as shown in FIG. 4. In other embodiments, a variation of a Langmuir-Blodgett deposition process can be used to transfer coated color-converting particles 100 from the floating portion of the plurality of coated color-converting particles directly onto a substrate. For example, a substrate can be placed in contact with a film of coated color-converting particles 100 on the surface of the separation liquid 252 to transfer the coated color-converting particles from the film to the substrate.

Figure 5:
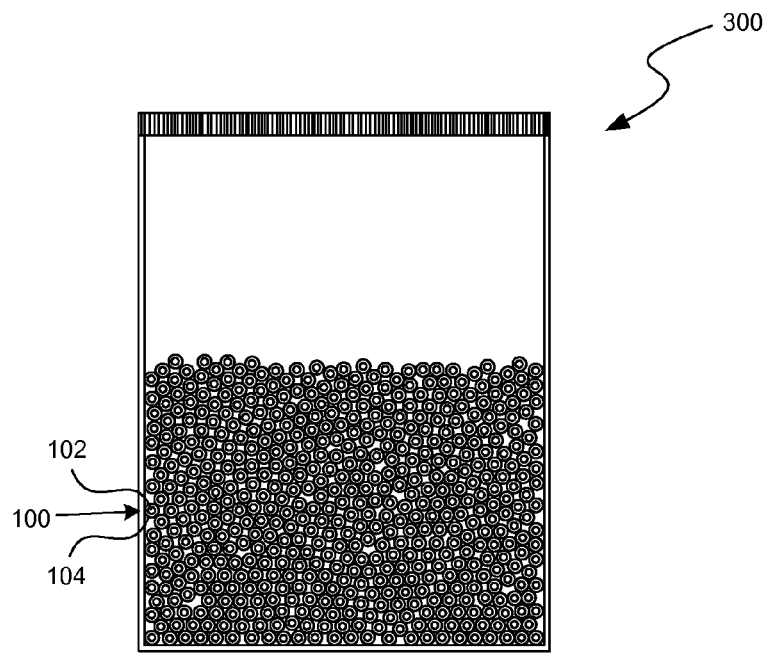
FIG. 5 is a partially schematic cross-sectional diagram of coated color-converting particles in a generally air-tight container configured in accordance with several embodiments of the present technology.

After separating the floating portion of the plurality of coated color-converting particles 100, the separation liquid 252 can be drained and the non-floating portion of the plurality of coated color-converting particles can be recovered for recycling or disposal. Recycling can include, for example, subjecting the non-floating portion of the plurality of coated color-converting particles 100 to another deposition process. The floating portion of the plurality of coated color-converting particles 100 can be dried or cleaned and then stored. FIG. 5 illustrates a generally air-tight container 300 suitable for storing the coated color-converting particles 100 prior to incorporating the coated color-converting particles into electrical devices. Coated color-converting particles 100 configured in accordance with several embodiments of the present technology, including coated color-converting particles processed with a separation step and coated color-converting particles processed without a separation step, may have a greater shelf-life than uncoated color-converting particles.

Figure 6:
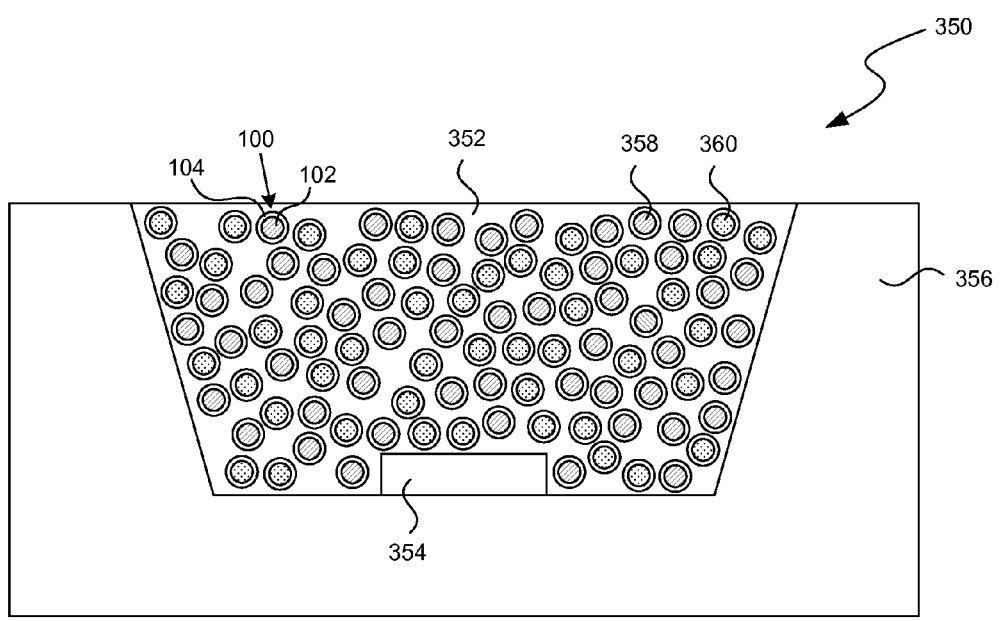
FIG. 6 is a partially schematic cross-sectional diagram of an SSRT device including coated color-converting particles configured in accordance with several embodiments of the present technology.

Coated color-converting particles 100 configured in accordance with embodiments of the present technology can be incorporated into any structure typically including color-converting particles. For example, the coated color-converting particles 100 can be mixed with a matrix material (e.g., silicone or epoxy) in an SSRT device or a component thereof. FIG. 6 is a partially schematic cross-sectional diagram of an SSRT device 350 including coated color-converting particles 100 configured in accordance with several embodiments of the present technology. The coated color-converting particles 100 are distributed in a matrix 352 positioned over an SSRT 354 and within a heat sink 356. In several embodiments of the present technology, a plurality of coated color-converting particles 100 is mixed with a matrix material that typically reacts with a color-converting material of the plurality of coated color-converting particles, such as at standard pressure and an operating temperature of the color-converting particles and the matrix 352 when a radiation transducer of the SSRT 354 is active. The coatings 104 of the coated color-converting particles 100 in the plurality of coated color-converting particles can prevent, slow, or otherwise inhibit reactions between the color-converting material and the matrix material. The matrix 352 can be permeable to an environmental constituent (e.g., at standard temperature and pressure) that is reactive with the color-converting material (e.g., at standard temperature and pressure). The coatings 104 of the coated color-converting particles 100 in the plurality of coated color-converting particles can also prevent, slow, or otherwise inhibit reactions between the color-converting material and the environmental constituent.

The coated color-converting particles 100 can be evenly distributed throughout the matrix 352 or concentrated in certain portions of the matrix. As shown in FIG. 6, the matrix 352 can surround generally all of the coated color-converting particles 100 individually. In several embodiments of the present technology, the coated color-converting particles 100 can be mixed into a non-solid (e.g., a liquid) matrix and then allowed to settle by gravity prior to solidifying the non-solid matrix to form a solid matrix. Coated color-converting particles 100 having different color-converting materials can be used together to create structures having a variety of optical properties. For example, several embodiments of the present technology include a combination of coated color-converting particles 100 including color-converting materials collectively configured to modify the emission of an SSRT 354 from blue to white. The SSRT device 350 shown in FIG. 6 includes a first color-converting material 358 in some of the particle cores 102 and a second color-converting material 360 in other particle cores. Particle cores 102 having the first color-converting material 358 and the second color-converting material 360 are randomly distributed in the matrix 352.

The foregoing description provides many specific details for a thorough understanding of, and enabling description for, embodiments of the present technology. Well-known structures and systems as well as methods often associated with such structures and systems have not been shown or described in detail to avoid unnecessarily obscuring the description of the various embodiments of the disclosure. In addition, those of ordinary skill in the relevant art will understand that additional embodiments can be practiced without several of the details described herein.

Throughout this disclosure, the singular terms "a," "an," and "the" include plural referents unless the context clearly indicates otherwise. Similarly, the word "or" is intended to include "and" unless the context clearly indicates otherwise. Directional terms, such as "upper," "lower," "front," "back," "vertical," and "horizontal," may be used herein to express and clarify the relationship between various elements. It should be understood that such terms do not denote absolute orientation. Reference herein to "one embodiment," "an embodiment," or similar formulations, means that a particular feature, structure, operation, or characteristic described in connection with the embodiment is included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

From the foregoing, it will be appreciated that specific embodiments of the present technology have been described herein for purposes of illustration, but that various modifications may be made without deviating from the technology. For example, the coated color-converting particle 100 illustrated in FIG. 1 can include a coating in addition to the coating 104. Certain aspects of the present technology described in the context of particular embodiments can be combined or eliminated in other embodiments. For example, the vanes 204 can be eliminated from the deposition chamber 158 shown in FIG. 3. Furthermore, while advantages associated with certain embodiments of the present technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

I claim:

1. A plurality of coated color-converting particles, comprising:
    a first coated color-converting particle having
        a first particle core including optically activatable color-converting material, and
        a first coating including fluorinated parylene at least generally surrounding the first particle core; and
    a second coated color-converting particle having
        a second particle core including optically activatable color-converting material, and
        a second coating including fluorinated parylene at least generally surrounding the second particle core,
    wherein
        the first and second coated color-converting particles are not bound to one another, and
        the first and second coated color-converting particles are held within a container.

2. The plurality of coated color-converting particles of claim 1, wherein the first and second coatings are at least generally defect free.

3. The plurality of coated color-converting particles of claim 1, wherein the first and second coatings include parylene AF-4.

4. The plurality of coated color-converting particles of claim 1, wherein the first and second coatings have respective average thicknesses greater than 0.1 micron.

5. The plurality of coated color-converting particles of claim 1, wherein the first and second particle cores include optically activatable doped color-converting material.

6. A plurality of coated color-converting particles, comprising:
    a first coated color-converting particle having
        a first particle core including optically activatable color-converting material, and
        a first coating including parylene at least generally surrounding the first particle core, the first coating having an average thickness greater than 0.1 micron; and
    a second coated color-converting particle having
        a second particle core including optically activatable color-converting material, and
        a second coating including parylene at least generally surrounding the second particle core, the second coating having an average thickness greater than 0.1 micron,
    wherein
        the first and second coated color-converting particles are not bound to one another, and
        the first and second coated color-converting particles are held within a container.

7. A composite, comprising:
a matrix material; and
a plurality of coated color-converting particles disposed within the matrix material,
wherein
the coated color-converting particles have respective particle cores and respective coatings at least generally surrounding the respective particle cores,
the particle cores include optically activatable color-converting material,
the coatings include parylene, and
the matrix material is compositionally distinct from the coatings.

8. The composite of claim 7, wherein the matrix material is optically transmissive.

9. The composite of claim 7, wherein the coatings include fluorinated parylene.

10. The composite of claim 7, wherein the coatings include parylene AF-4.

11. The composite of claim 7, wherein the coatings are at least generally defect free.

12. The composite of claim 7, wherein the coatings have respective average thicknesses greater than 0.1 micron.

13. The composite of claim 7, wherein the particle cores include optically activatable doped color-converting material.

14. The composite of claim 7, wherein the plurality of coated color-converting particles includes:
a first coated color-converting particle having a first particle core including optically activatable color-converting material of a first type, and
a second coated color-converting particle having a second particle core including optically activatable color-converting material of a second type different than the first type.

15. The composite of claim 7, wherein:
the matrix material is permeable to an environmental constituent at standard temperature and pressure, and
the particle cores include color-converting material that is reactive with the environmental constituent at standard temperature and pressure.

16. The composite of claim 15, wherein the environmental constituent is oxygen or water.

17. The composite of claim 15, wherein the particle cores include color-converting material that is oxidized by the environmental constituent at standard temperature and pressure.

18. A light-emitting diode device, comprising:
a light-emitting diode; and
an optical component positioned so that light exiting the light-emitting diode passes through the optical component, the optical component including
a matrix material; and
a plurality of coated color-converting particles disposed within the matrix material,
wherein
the coated color-converting particles have respective particle cores and respective coatings at least generally surrounding the respective particle cores,
the particle cores include optically activatable color-converting material,
the coatings include parylene, and
the matrix material is compositionally distinct from the coatings.

19. The light-emitting diode device of claim 18, wherein the particle cores include color-converting material that is reactive with the matrix material at standard pressure and an operating temperature of the optical component when the light-emitting diode is active.

20. The light-emitting diode device of claim 18, wherein the matrix material is optically transmissive.

21. The light-emitting diode device of claim 18, wherein the coatings include fluorinated parylene.

22. The light-emitting diode device of claim 18, wherein the coatings include parylene AF-4.

23. The light-emitting diode device of claim 18, wherein the coatings are at least generally defect free.

24. The light-emitting diode device of claim 18, wherein the coatings have respective average thicknesses greater than 0.1 micron.

25. The light-emitting diode device of claim 18, wherein the particle cores include optically activatable doped color-converting material.

26. The light-emitting diode device of claim 18, wherein:
the matrix material is permeable to an environmental constituent at standard temperature and pressure, and
the particle cores include color-converting material that is reactive with the environmental constituent at standard temperature and pressure.

27. The light-emitting diode device of claim 26, wherein the environmental constituent is oxygen or water.

28. The light-emitting diode device of claim 26, wherein the particle cores include color-converting material that is oxidized by the environmental constituent at standard temperature and pressure.

29. A method, comprising:
combining a plurality of coated color-converting particles into a non-solid matrix so that the non-solid matrix surrounds the coated color-converting particles; and
solidifying the non-solid matrix to form a solid matrix,
wherein
the coated color-converting particles have respective particle cores and respective coatings at least generally surrounding the respective particle cores,
the particle cores include optically activatable color-converting material,
the coatings include parylene, and
the matrix material is compositionally distinct from the coatings.

30. The method of claim 29, further comprising forming the plurality of coated color-converting particles, including moving the particle cores through a vapor including a monomer radical of parylene.

31. A method, comprising:
combining a plurality of coated color-converting particles with a separation liquid such that a first portion of the plurality of coated color-converting particles floats on the separation liquid and a second portion of the plurality of coated color-converting particles sinks in the separation liquid after combining the plurality of coated color-converting particles with the separation liquid; and
removing the first portion of the plurality of coated color-converting particles, the second portion of the plurality of coated color-converting particles, or both from the separation liquid,
wherein
the coated color-converting particles have respective particle cores and respective coatings at least generally surrounding the respective particle cores,
the particle cores include optically activatable color-converting material, and
the coatings include fluorinated parylene.

32. The method of claim 31, wherein:
removing the first portion of the plurality of coated color-converting particles, the second portion of the plurality of coated color-converting particles, or both from the separation liquid includes removing the first portion of the plurality of coated color-converting particles from the separation liquid; and
the method further comprises storing the first portion of the plurality of coated color-converting particles in an at least generally air-tight container after removing the first portion of the plurality of coated color-converting particles from the separation liquid.

33. The method of claim 31, further comprising forming the plurality of coated color-converting particles, including moving the particle cores through a vapor including a monomer radical of parylene.

34. The method of claim 31, further comprising recoating one or more coated color-converting particles of the second portion of the plurality of coated color-converting particles, including moving the one or more coated color-converting particles of the second portion of the plurality of coated color-converting particles through a vapor including a monomer radical of parylene.

\* \* \* \* \*